(12) United States Patent
Ross

(10) Patent No.: US 12,373,144 B2
(45) Date of Patent: *Jul. 29, 2025

(54) ADDRESSING IN MEMORY WITH A READ IDENTIFICATION (RID) NUMBER

(71) Applicant: Micron Technology, Inc., Boise, ID (US)

(72) Inventor: Frank F. Ross, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/743,998

(22) Filed: Jun. 14, 2024

(65) Prior Publication Data

US 2024/0329887 A1 Oct. 3, 2024

Related U.S. Application Data

(63) Continuation of application No. 17/409,212, filed on Aug. 23, 2021, now Pat. No. 12,014,082, which is a
(Continued)

(51) Int. Cl.
*G06F 3/06* (2006.01)
*G06F 12/0868* (2016.01)
*G06F 13/16* (2006.01)

(52) U.S. Cl.
CPC .......... *G06F 3/0659* (2013.01); *G06F 3/0629* (2013.01); *G06F 3/0649* (2013.01); *G06F 12/0868* (2013.01); *G06F 13/16* (2013.01)

(58) Field of Classification Search
CPC .... G06F 3/0659; G06F 13/16; G06F 12/0868; G06F 3/0649; G06F 3/0629
See application file for complete search history.

(56) References Cited

U.S. PATENT DOCUMENTS 6,061,764 A 5/2000 Chittor et al.
6,370,605 B1 4/2002 Chong
(Continued)

FOREIGN PATENT DOCUMENTS

CN 101689145 3/2010
CN 103890688 6/2014
(Continued)

OTHER PUBLICATIONS

International Search Report and Written Opinion for related PCT Application No. PCT/US2019/049001, dated Dec. 27, 2019, 13 pages.
(Continued)

*Primary Examiner* — Tasnima Matin
(74) *Attorney, Agent, or Firm* — Brooks, Cameron & Huebsch, PLLC

(57) ABSTRACT

The present disclosure includes apparatuses and methods related to a memory apparatus and/or method for addressing in memory with a read identification (RID) number. An example apparatus can include a first memory device, a second memory device coupled to the first memory device, and a controller coupled to the first memory device and the second memory device, wherein the controller is configured to receive a read command requesting data from the first memory device, wherein the read command includes a read identification (RID) number that includes an address to identify a location of the data in the first memory device, and transfer the data from the location in the first memory device to the second memory device in response receiving the read command.

20 Claims, 5 Drawing Sheets

Related U.S. Application Data continuation of application No. 16/139,769, filed on Sep. 24, 2018, now Pat. No. 11,099,779.

(56) References Cited

U.S. PATENT DOCUMENTS

| | | | |
|---|---|---|---|
| 9,653,184 | B2 | 5/2017 | Frayer et al. |
| 2007/0198798 | A1 | 8/2007 | Kanai et al. |
| 2008/0010420 | A1 | 1/2008 | Kao |
| 2008/0104307 | A1 | 5/2008 | Van Rooyen |
| 2009/0089486 | A1 | 4/2009 | Cheung et al. |
| 2011/0264851 | A1 | 10/2011 | Jeon et al. |
| 2012/0026623 | A1 | 2/2012 | Mathew et al. |
| 2013/0219105 | A1 | 8/2013 | Confalonieri |
| 2014/0237170 | A1* | 8/2014 | Okita ............ G06F 12/0246 711/103 |
| 2015/0255130 | A1 | 9/2015 | Lee et al. |
| 2015/0279461 | A1 | 10/2015 | Chinnakkonda Vidyapoornachary et al. |
| 2015/0370484 | A1* | 12/2015 | Kawaguchi ......... G06F 3/0611 711/165 |
| 2016/0098354 | A1 | 4/2016 | Hampel et al. |
| 2016/0196223 | A1 | 7/2016 | Lee et al. |
| 2016/0306566 | A1 | 10/2016 | Lu et al. |
| 2017/0075576 | A1 | 3/2017 | Cho |
| 2017/0242593 | A1 | 8/2017 | Riley et al. |
| 2017/0357604 | A1 | 12/2017 | Lim et al. |
| 2017/0371776 | A1 | 12/2017 | Riley et al. |
| 2018/0004422 | A1 | 1/2018 | Riley et al. |
| 2018/0059933 | A1 | 3/2018 | Helmick et al. |
| 2018/0181494 | A1 | 6/2018 | Malladi et al. |
| 2018/0246643 | A1 | 8/2018 | Jenne et al. |
| 2018/0246790 | A1 | 8/2018 | Sankaranarayanan et al. |

FOREIGN PATENT DOCUMENTS

| | | |
|---|---|---|
| CN | 104981873 | 10/2015 |
| KR | 10-2017-0020851 | 2/2017 |
| WO | 2017192346 | 11/2017 |

OTHER PUBLICATIONS

Extended search report from related European Patent Application No. 19867953.2, dated May 27, 2022, 9 pages.

* cited by examiner

ADDRESSING IN MEMORY WITH A READ IDENTIFICATION (RID) NUMBER

PRIORITY INFORMATION

This application is a Continuation of U.S. application Ser. No. 17/409,212, filed Aug. 23, 2021, which issues as U.S. Pat. No. 12,014,082 on Jun. 18, 2024, which is Continuation of U.S. application Ser. No. 16/139,769, filed Sep. 24, 2018, which issued as U.S. Pat. No. 11,099,779 on Aug. 24, 2021, the contents of which are included herein by reference.

TECHNICAL FIELD

The present disclosure relates generally to memory devices, and more particularly, to apparatuses and methods for addressing in memory with a read identification (RID) number.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be using a main memory in computing systems.

DETAILED DESCRIPTION

Figure 1A:
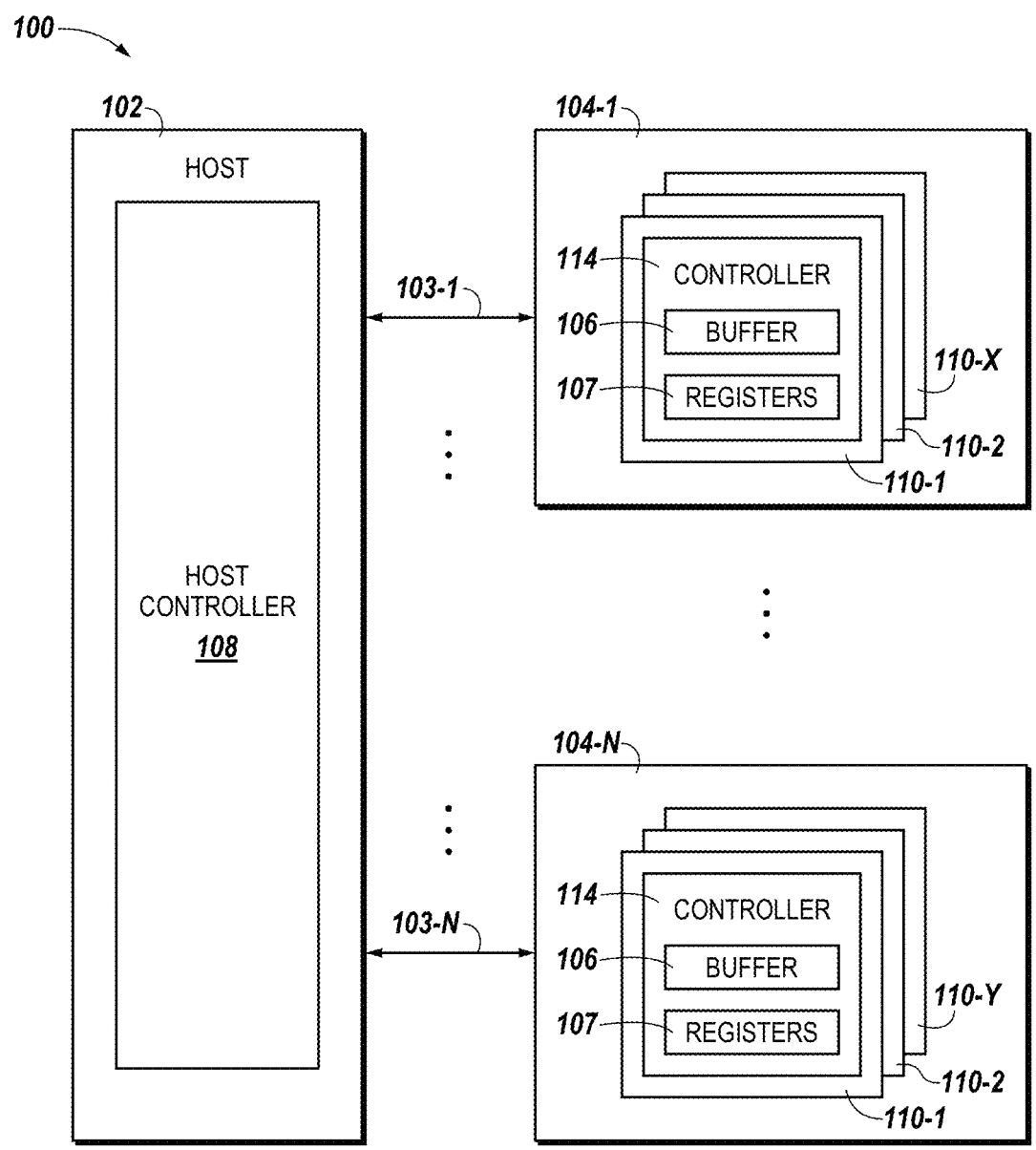
FIG. 1A is a block diagram of an apparatus in the form of a computing system including a memory apparatus in accordance with a number of embodiments of the present disclosure.

The present disclosure includes apparatuses and methods related to a memory apparatus and/or method for addressing in memory with a read identification (RID) number. An example apparatus can include a first memory device, a second memory device coupled to the first memory device, and a controller coupled to the first memory device and the second memory device, wherein the controller is configured to receive a read command requesting data from the first memory device, wherein the read command includes a read identification (RID) number that includes an address to identify a location of the data in the first memory device, and transfer the data from the location in the first memory device to the second memory device in response receiving the read command.

In a number of embodiments, a dual in-line memory module (DIMM) can receive a number of commands, where each of the commands include an RID number. The RID numbers can include a first portion that identifies a location (e.g., address) of the data requested by the command and a second portion that uniquely identifies the command from other commands. The DIMM does not have to respond to the commands in the order in which the DIMM receives the commands. For example, if a controller on the DIMM locates the data associated with a command before it locates data associated with another command that was received prior to the command, the DIMM can send a response to the host indicating the data associated with the command is ready to be sent to a memory devices and/or or host without having to wait for the controller locate the data associated with the another command. Controller can include the second portion of the RID number, that uniquely identifies the command, in the response and/or when transferring the data to memory devices and/or host to inform host which of the number of commands is be executed.

In a number of embodiments, an XREAD can be send a DIMM requesting a transfer of data from a first memory device to a second memory device on the DIMM. An XREAD command may be a read command directed to a nonvolatile memory array or die on the DIMM. The XREAD may be variously referred to in different protocols or memory access schemes, and the functionality described herein is applicable irrespective of the label of the command. In other words, the term XREAD is illustrative, not limiting The XREAD command can include a read identification number (RID). The RID number can include an address that identifies a location in the first memory device where the data that is be requested is located. The RID number can be used by the host to address data in the first memory devices. A controller on the DIMM can send a signal to the host indicating that the data associated with the command has been transferred to the second memory device. The controller on the DIMM can also send an offset associated with the location (e.g., address) of the data in the second memory device for use by the host when retrieving the data from the second memory device.

In a number of embodiments, an SREAD command can be sent to a DIMM requesting a transfer of data from a memory device to a host. An SREAD command may be a read command directed to a volatile memory array or die on the DIMM. The SREAD may be variously referred to in different protocols or memory access schemes, and the functionality described herein is applicable irrespective of the label of the command. So the term SREAD is illustrative, not limiting. The memory device can be a memory device that received data from another memory device as part of an XREAD command. The SREAD command can include the offset for the location of the data in memory device and a controller on the DIMM can execute the command by sending instructions to the memory device to send the data requested by the command from the location identified by the offset in the memory devices to a host. A controller can execute an SREAD command using the address with offset to locate the data in the memory device without having to query whether the data is in a buffer and/or other memory devices.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1A is a functional block diagram of a computing system 100 including an apparatus in the form of a number of memory systems 104-1 . . . 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1A, memory systems 104-1 . . . 104-N can include a one or more dual in-line memory modules (DIMM) 110-1, . . . , 110-X, 110-Y. The DIMMs 110-1, . . . , 110-X, 110-Y can include volatile memory and/or non-volatile memory. In a number of embodiments, memory systems 104-1, . . . , 104-N can include a multi-chip device. A multi-chip device can include a number of different memory types and/or memory modules. For example, a memory system can include non-volatile or volatile memory on any type of a module. The examples described below in association with FIGS. 1A-7 use a DIMM as the memory module, but the embodiments of the present disclosure can be used on any memory system that include volatile and/or non-volatile memory. In FIG. 1A, memory system 104-1 is coupled to the host via channel 103-1 can include DIMMs 110-1, . . . , 110-X, where DIMM 110-1 is a NVDIMM and 110-X is DRAM DIMM. In this example, each DIMM 110-1, . . . , 110-X, 110-Y includes a controller 114. Controller 114 can receive commands from host 102 and control execution of the commands on a DIMM. Also, in a number of embodiments, the protocol of the present disclosure could be implemented by a memory device (e.g., a DIMM) without a controller and execution of the commands using the protocol of the present disclosure could be built into the memory device. The host 102 can send commands to the DIMMs 110-1, . . . , 110-X, 110-Y using the protocol of the present disclosure and/or a prior protocol, depending on the type of memory in the DIMM. For example, the host can use the protocol of the present disclosure to communicate on the same channel (e.g., channel 103-1) with a NVDIMM and a prior protocol to communicate with a DRAM DIMM that are both on the same memory system 104.

As illustrated in FIG. 1A, a host 102 can be coupled to the memory systems 104-1 . . . 104-N. In a number of embodiments, each memory system 104-1 . . . 104-N can be coupled to host 102 via a channel (e.g., channels 103-1, . . . , 103-N). In FIG. 1A, memory system 104-1 is coupled to host 102 via channel 103-1 and memory system 104-N is coupled to host 102 via channel 103-N. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory systems 104-1 . . . 104-N. The host controller 108 can send commands to the DIMMs 110-1, . . . , 110-X, 110-Y via channels 103-1 . . . 103-N. The host controller 108 can communicate with the DIMMs 110-1, . . . 110-X, 110-Y and/or the controller 114 on each of the DIMMs 110-1, . . . , 110-X, 110-Y to read, write, and erase data, among other operations. A physical host interface can provide an interface for passing control, address, data, and other signals between the memory systems 104-1 . . . 104-N and host 102 having compatible receptors for the physical host interface. The signals can be communicated between 102 and DIMMs 110-1, . . . , 110-X, 110-Y on a number of buses, such as a data bus and/or an address bus, for example, via channels 103-1 . . . 103-N.

The host controller 108 and/or controller 114 on a DIMM can include control circuitry, e.g., hardware, firmware, and/ or software. In one or more embodiments, the host controller 108 and/or controller 114 can be an application specific integrated circuit (ASIC) and/or a field programmable gate array (FPGA) coupled to a printed circuit board including a physical interface. Also, each DIMM 110-1, . . . , 110-X, 110-Y can include buffers 116 of volatile and/or non-volatile memory and registers 107. Buffer 106 can be used to buffer data that is used during execution of commands.

The DIMMs 110-1, . . . , 110-X, 110-Y can provide main memory for the memory system or could be used as additional memory or storage throughout the memory system. Each DIMM 110-1, . . . , 110-X, 110-Y can include one or more arrays of memory cells, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1A can include additional circuitry that is not illustrated so as not to obscure embodiments of the present disclosure. For example, the memory systems 104-1 . . . 104-N can include address circuitry to latch address signals provided over I/O connections through I/O circuitry. Address signals can be received and decoded by a row decoder and a column decoder to access the DIMMs 110-1, . . . , 110-X, 110-Y. It will be appreciated by those skilled in the art that the number of address input connections can depend on the density and architecture of the DIMMs 110-1, . . . , 110-X, 110-Y.

Figure 1B:
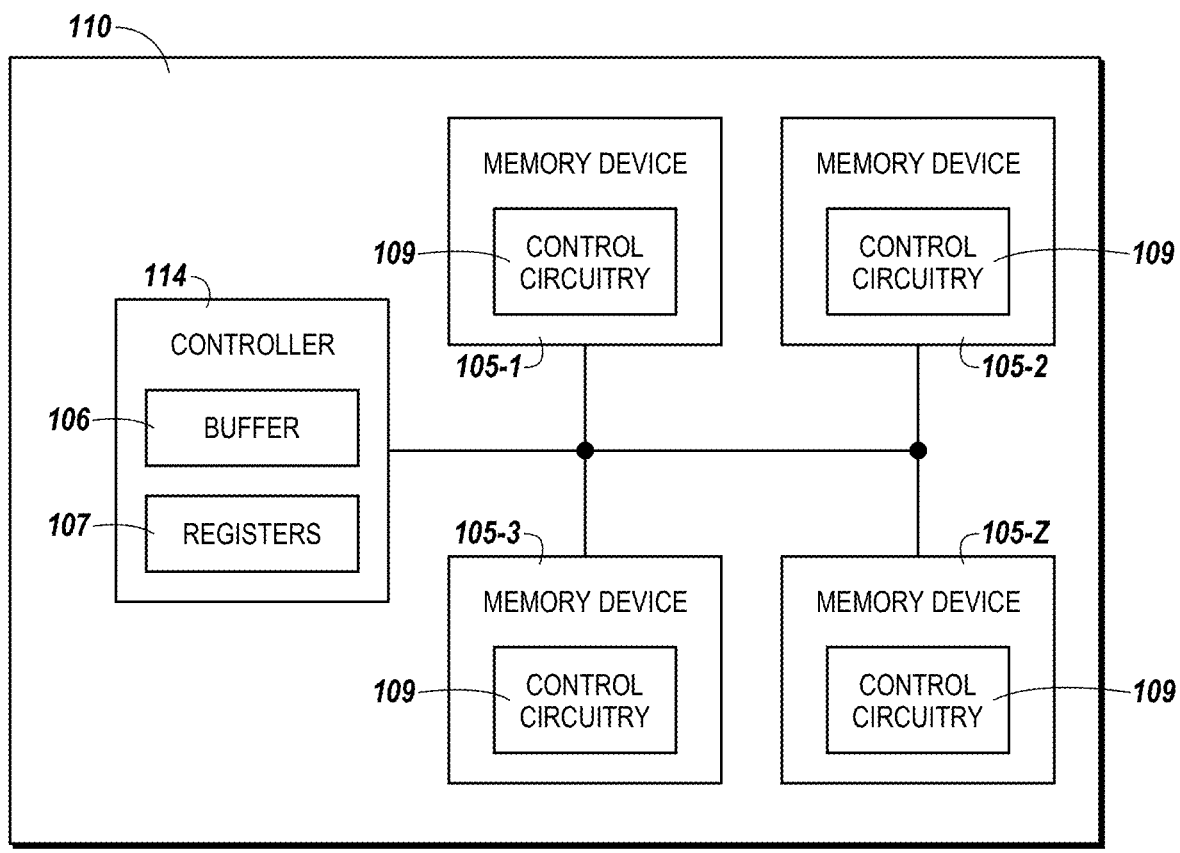
FIG. 1B is a block diagram of a non-volatile DIMM (NVDIMM) of a memory apparatus in accordance with a number of embodiments of the present disclosure.

FIG. 1B is a block diagram of an apparatus in the form of a dual in-line memory modules (DIMM) 110 in accordance with a number of embodiments of the present disclosure. In FIG. 1B, DIMM 110 can include a controller 114. Controller 114 can include memory, such as SRAM memory, that can be a buffer 106 and/or a number of registers 107. DIMM 110 can include a number of memory devices 105-1, . . . , 105-Z coupled to the controller. Memory devices 105-1, . . . , 105-Z can be volatile and/or non-volatile memory devices, such as memory devices 221 and 224 in FIG. 2, and include non-volatile memory arrays and/or volatile memory arrays. Memory devices 105-1, . . . , 105-Z can include control circuitry 109 (e.g., hardware, firmware, and/or software) which can be used to execute commands on the memory devices 105-1, . . . , 105-Z. The control circuitry 109 can receive commands from controller 114. The control circuitry 109 can be configured to execute commands to read and/or write data in the memory devices 105-1, . . . , 105-Z.

Figure 2:
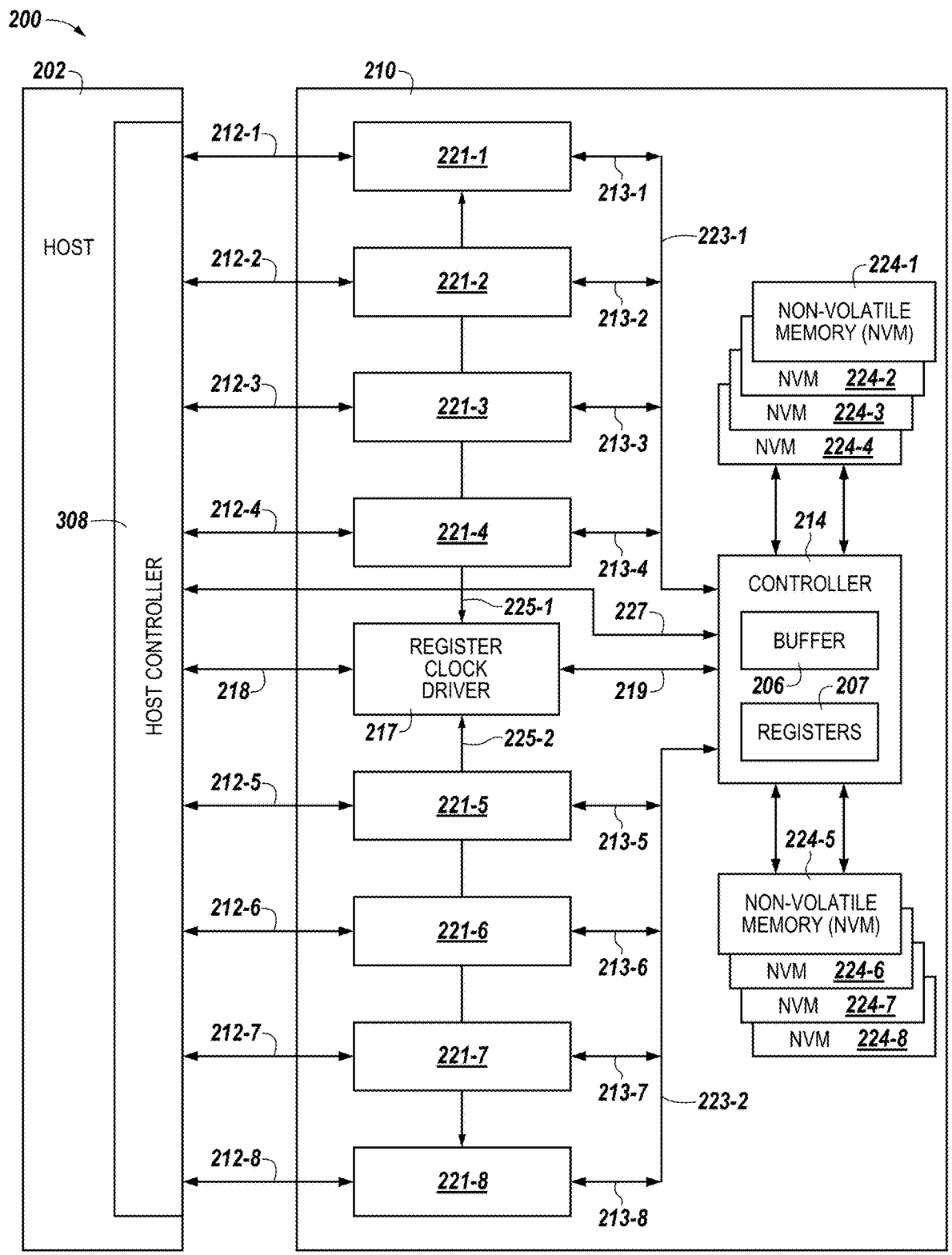
FIG. 2 is a block diagram of a computing system including a host and a memory system comprising a dual in-line memory module (DIMM) with a ready/busy bus in accordance with a number of embodiments of the present disclosure.

FIG. 2 is a block diagram of a computing system 200 including a host 202 and a memory system comprising a dual in-line memory module (DIMM) 210 with a ready/busy bus in accordance with a number of embodiments of the present disclosure. In FIG. 2, host 202 is coupled to DIMM 210 via data buses 212-1, . . . , 212-16, command/address bus 218, and ready/busy bus 227. Host 202 can be coupled to DIMM 210 via a number of channels (e.g., channels 103-1, . . . , 103-N in FIG. 1A). For example, host 202 is coupled to DIMM 210 via a first channel that includes data buses 212-1, . . . , 212-4, command/address bus 218, and ready/busy bus 227; and host 202 is coupled to DIMM 210 via a second channel that includes data buses 212-5, . . . , 212-8, command address/bus 218, and ready/busy bus 227.

DIMM 210 can include a first number of memory devices 221-1, . . . , 221-8. For example, memory devices 221-1, . . . , 221-16 can be DRAM memory devices, among other types of volatile and/or non-volatile memory. DIMM 210 can include a second number of memory devices 224-1, . . . , 224-8. For example, memory devices 224-1, . . . , 224-8 can be 3D XPoint memory devices, among other types of volatile and/or non-volatile memory.

Controller 214 can send a ready/busy signal to host 202 on the ready/busy bus 227. The ready/busy signal can indicate to host 202 whether or not the controller is ready to receive commands from host 202. For example, if DIMM 210 is busy executing commands, such as transferring data between memory devices 221-1, . . . , 221-4 and memory devices 224-1, . . . , 224-4, for example, the DIMM and is not ready to receive commands, so a ready/busy signal can be sent on ready/busy bus 227 to host 202 that indicates DIMM 210 is not ready to receive commands. Once DIMM 210 is no longer busy executing commands DIMM 210 can send a ready/busy signal on ready/busy bus 227 to host 202 indicating DIMM 210 is ready to receive commands from host 202. Host 202 can send commands to DIMM 210 in response to receiving the ready/busy signal.

Controller 214 can receive commands from host 202. The commands from host 202 can be sent to register clock driver (RCD) 217 via bus 218 and the commands can be sent from RCD 217 to controller 214 via bus 219. Controller 214 can receive the commands from RCD 217 and store data associated with the commands (e.g., command instructions and/or data read from and/or to be written to memory devices 221 and/or 224 during execution of the commands) in buffer 206. The controller can send the commands to memory devices 221-1, . . . , 221-8 on bus 225-1 and/or 225-2 via RCD 217 and memory devices 221-1, . . . , 221-8 can execute the commands by transferring data between memory devices 221-1, . . . 221-8 and host 202 and/or memory devices 221-1, . . . , 221-8 and memory device 224-1, . . . , 224-8. Memory devices 221-1, . . . , 221-8 can send signals on buses 225-1 and 225-2 to RCD 217 and controller 214 that indicate memory devices 221-1, . . . , 221-8 have completed execution of commands and are ready for additional commands. Once a command has been executed, controller 214 can send a status signal to the host 202 indicating that the command received from host 202 has been executed. Controller 214 can include non-volatile and/or volatile memory, such as SRAM memory, that can be a buffer 206 and/or a register 207 used during execution of commands Memory system 200 can be configured to execute commands sent from host 202 to DIMM 210 by sending command/address information from the host controller 208 on command/address bus 218 to the register clock driver (RCD) 217 and data on data buses 212-1, . . . , 212-8. The commands from the host can include address information for memory devices 221-1, . . . 221-8 where the host is requesting an operation on data at particular location in memory devices 221-1, 221-16. The commands from the host can include address information for memory devices 224-1, . . . , 224-4 where the host is requesting an operation on data at particular location in memory devices 224-1, . . . , 224-4, while memory devices 221-5, . . . 221-8 can act as a buffer during execution of the commands.

In a number of embodiments, a command (e.g., an XREAD command) can be sent to controller requesting a transfer of data from memory devices 224-1, . . . , 224-4 to memory devices 221-1, . . . 221-4. The command can include a read identification number (RID). The RID number can include an address that identifies a location in memory devices 224-1, . . . , 224-4 where the data that is be requested is located. The RID number can be used by the host to address data in memory devices 224-1, . . . , 224-4. Controller 214 can execute the command by sending instructions to memory devices 224-1, ..., 224-4 to send the data requested by the command from the location identified by the RID number to memory devices 221-1, ..., 221-4 via controller 214. Controller 214 can send a signal on ready/busy bus 227 and/or buses 219 and 218 via RCD 217 to the host 202 indicating that the data associated with the command has been transferred to memory devices 221-1, ..., 221-4. Controller 214 can also send an offset associated with the location (e.g., address) of the data in memory devices 221-1, ..., 221-4

In a number of embodiments, a command (e.g., an SREAD command) can be sent to controller 214 requesting a transfer of data from memory devices 221-1, ... 221-4 to host 202. The command can request at least portion of data that was transferred from memory devices 224-1, ..., 224-4 to memory devices 221-1, ... 221-4 via an XREAD command. The command can include the offset for the location of the data in memory devices 221-1, ... 221-4. Controller 214 can execute the command by sending instructions to memory devices 221-1, ... 221-4 to send the data requested by the command from the location identified by the offset in memory devices 221-1, ..., 221-4 to host 202. Controller 214 can execute the command (e.g., an SREAD command) using the address with offset from the command to locate the data in memory devices 221-1, ... 221-4 without having to query whether the data is in the buffer 206 and/or memory devices 224-1, ..., 224-8.

DIMM 210 can receive a number of commands, where each of the commands include an RID number. The RID numbers can include a first portion that identifies a location (e.g., address) of the data requested by the command and a second portion that uniquely identifies the command from other commands. Controller 214 can inspect the buffer 206 and/or cache (e.g., memory devices 221-5, ... 221-8 when configured as cache for DIMM 210) to locate the data associated with the commands. If the data is not in the buffer 206 and/or cache, the controller 214 can send instructions to memory devices 224-1, ..., 224-8 to send the data requested by the command from the location identified by the RID number to memory devices 221-1, ..., 221-4 via controller 214. When DIMM 210 receives a number of commands (e.g., read commands), the NVDIMM controller does not have to respond to the commands in the order in which the DIMM 210 receives the commands. For example, if the controller 214 locates the data associated with a command before it locates data associated with another command that was received prior to the command, the DIMM 210 can send a read ready command indicating the data associated with the command is ready to be sent to memory devices 221-1, ... 221-4 without having to wait for the controller 214 locate the data associated with the another command. Controller can include the second portion of the RID number, that uniquely identifies the command, in the read ready command and/or when transferring the data to memory devices 221-1, ... 221-4 to inform host which of the number of commands is be executed.

Due to the DIMM 210 being able to respond to read commands in an order that is different to the order in which the read commands are received, the host will not know with which read command a particular data transmission is associated without the second portion of the RID number. The number of outstanding reads the host can issue can be dependent on the number of bits in the second portion of the RID signal, the number of beats in the data packet, and the number of reads the controller 214 can support.

In a number of embodiments, memory devices 221-1, ... 221-8 can be configured as cache. For example, memory devices can be configured as cache for the data stored in memory devices 224-1, ..., 224-8 and/or other memory devices coupled to the computing system. The DIMM 210 can be configured to have a portion of memory devices 221-1, ... 221-8 addressable by host 202 and a portion of the memory devices 221-1, ... 221-8 configured as cache.

In a number of embodiments, commands can be received from host 202 and/or generated by controller 214 to transfer data between memory devices 224-1, ..., 224-8. Data can be transferred between memory devices 224-1, ..., 224-8 via controller 214 using buffer 206 and/or registers 207.

Figure 3A:
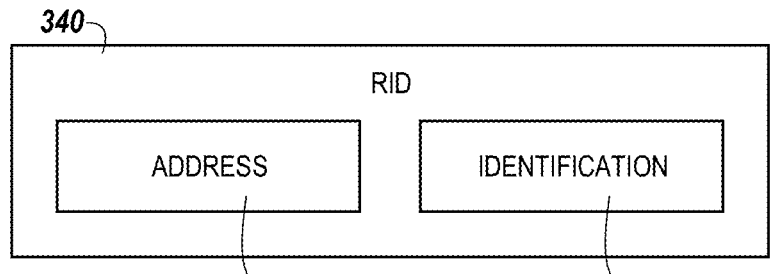
FIG. 3A is a block diagram of a command including a read identification (RID) in accordance with a number of embodiments of the present disclosure.

FIG. 3A is a block diagram of a command including a read identification (RID) in accordance with a number of embodiments of the present disclosure. Read identification (RID) number 340 can be included in a number of commands. RID number 340 can be included in read commands sent from a host to a DIMM. RID number 340 can also be included in responses from a DIMM to a host. RID 340 can include a first portion 342 that includes a number of bits that identifies a location of data (e.g., address) in a memory device requested by a command. The first portion 342 of RID 340 can be used to address particular locations in a memory device by a host. RID 340 can include a second portion 344 that includes a number of bits that uniquely identifies a command from other commands sent by the host to a DIMM. The second portion 344 of RID 340 can be sent between a host and a DIMM so that the host and DIMM are able track which command is being executed by associating the second portion 344 of RID 340 with the data is being transferred when executing a command.

Figure 3B:
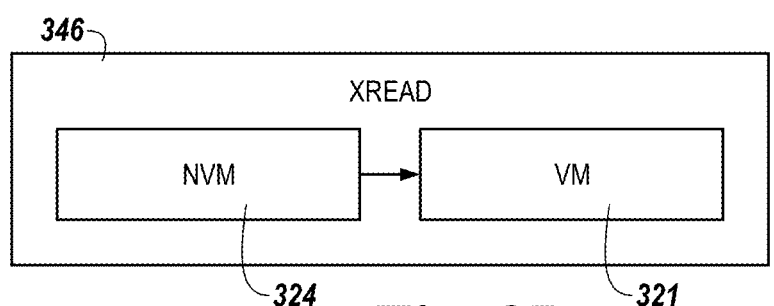
FIG. 3B is a block diagram of an XREAD command in accordance with a number of embodiments of the present disclosure.

FIG. 3B is a block diagram of an XREAD command in accordance with a number of embodiments of the present disclosure. An XREAD command 346 can include instructions to transfer data from non-volatile memory 324 in a DIMM to volatile memory 321 in the DIMM. The XREAD command can include an RID number that is used to address a location in non-volatile memory 324 where the data to be transferred when executing the command is located.

Figure 3C:
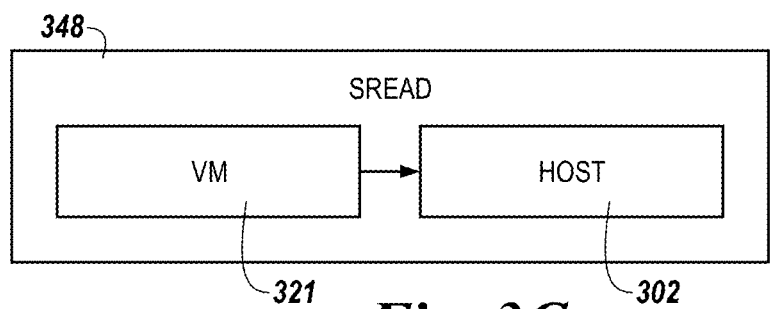
FIG. 3C is a block diagram of an SREAD command in accordance with a number of embodiments of the present disclosure.

FIG. 3C is a block diagram of an SREAD command in accordance with a number of embodiments of the present disclosure. An SREAD command 348 can include instructions to transfer data from volatile memory 321 to a host 302 that requested the data. The SREAD command can include an offset that is used to address a location in volatile memory 321 where the data that was transferred to the volatile memory 321 during an XREAD command is located.

Figure 4:
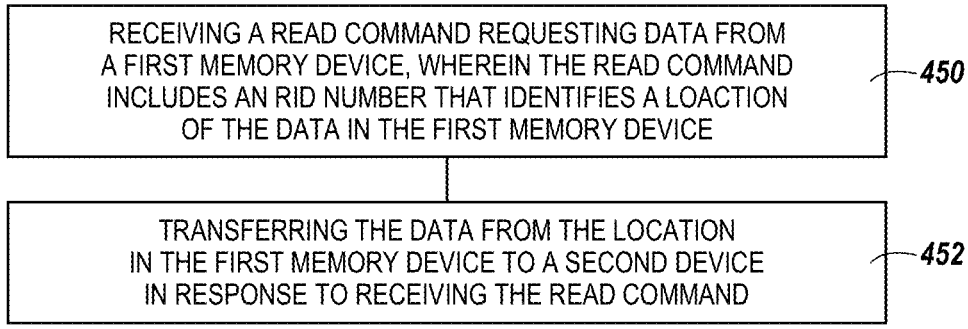
FIG. 4 is a flow diagram illustrating an example memory process including addressing in memory with a read identification (RID) number in accordance with a number of embodiments of the present disclosure.

FIG. 4 is a flow diagram illustrating an example memory process including addressing in memory with a read identification (RID) number in accordance with a number of embodiments of the present disclosure. The process described in FIG. 4 can be performed by, for example, a memory system including a NVDIMM such as DIMM 210 shown in FIG. 2.

At block 450, the process can include receiving a read command requesting data from a first memory device, wherein the read command includes a read identification (RID) number that identifies a location of the data in the first memory device. The RID number can be used to address locations in the first memory by a host.

At block 452, the process can include transferring the data from the location in the first memory device to a second memory device in response receiving the read command. The command can be an XREAD command that transfers data from non-volatile memory to volatile memory on a DIMM.

Figure 5:
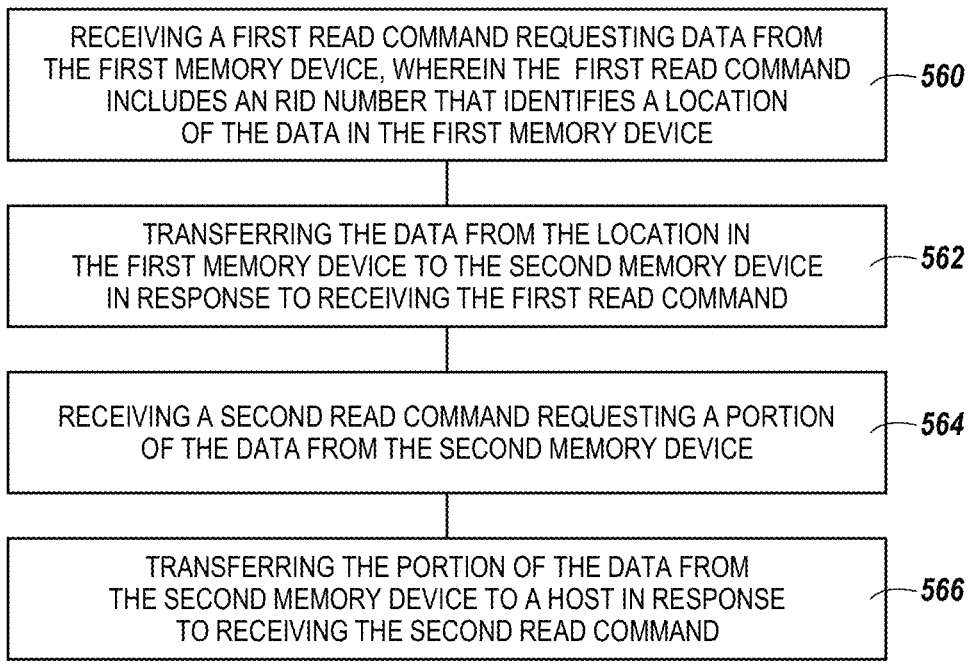
FIG. 5 is a flow diagram illustrating an example memory process including transferring data to a host using a read identification (RID) number in accordance with a number of embodiments of the present disclosure.

FIG. 5 is a flow diagram illustrating an example memory process including transferring data to a host using a read identification (RID) number in accordance with a number of embodiments of the present disclosure. The process described in FIG. 5 can be performed by, for example, a memory system including a NVDIMM such as DIMM 210 shown in FIG. 2.

At block 560, the process can include receiving a first read command requesting data from the first memory device, wherein the first read command includes a read identification (RID) number that identifies a location of the data in the first memory device.

At block 562, the process can include transferring the data from the location in the first memory device to the second memory device in response receiving the first read command. The command can be an XREAD command that transfers data from non-volatile memory to volatile memory on a DIMM.

At block 564, the process can include receiving a second read command requesting a portion of the data from the second memory device. The command can include an offset in an address used to locate the data in the second memory device.

At block 566, the process can include transferring the portion of the data from the second memory device to a host in response receiving the second read command. The command can be an SREAD command that transfers data from volatile memory to a host.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). For the avoidance of doubt, a list of at least one of A, B, or C, or any combination thereof is likewise an inclusive list. Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a first memory device;
   a second memory device coupled to the first memory device; and
   a controller coupled to the first memory device and the second memory device, wherein the first memory device and the second memory device are located on a dual in-line memory module (DIMM) coupled to the controller and the controller is configured to:
   receive a read command requesting data from the first memory device, wherein the read command includes a read identification (RID) number having a first portion that includes an address to identify a location of the data in the first memory device and a second portion having a unique identifier to identify the read command from other commands;
   transfer the data from the location in the first memory device to the second memory device in response to receiving the read command, wherein the controller transfers the second portion of the RID number including the unique identifier along with the data.

2. The apparatus of claim 1, wherein the controller is configured to send a signal to a host indicating the data has been transferred from the location in the first memory device to the second memory device.

3. The apparatus of claim 1, wherein the controller is further configured to receive another read command from the host requesting the data from the second memory device.

4. The apparatus of claim 3, wherein the controller is further configured to transfer the data from the second memory device to the host in response to receiving the other read command.

5. The apparatus of claim 1, wherein the controller is further configured to receive a write operation to write modified data back to the location in the first memory device.

6. The apparatus of claim 1, wherein the data requested in the read command is an amount of data corresponding to a block of data in the second memory device.

7. The apparatus of claim 1, wherein the first memory device is a non-volatile memory (NVM) device and the second memory device is a volatile memory (VM) device.

8. An apparatus, comprising:
   a first memory device;
   a second memory device coupled to the first memory device; and
   a controller coupled to the first memory device and the second memory device, wherein the first memory device and the second memory device are located on a dual in-line memory module (DIMM) coupled to the controller and the controller is configured to:
receive a first read command requesting data from the first memory device, wherein the first read command includes a read identification (RID) number having a first portion that identifies a location of the data in the first memory device and a second portion having a unique identifier to identify the first read command from other commands;
transfer the data from the location in the first memory device to the second memory device in response to receiving the first read command, wherein the second portion of the RID number including the unique identifier is transferred along with the data;
receive a second read command requesting a portion of the data from the second memory device; and
transfer the portion of the data from the second memory device in response to receiving the second read command.

9. The apparatus of claim 8, wherein the first read command is an XREAD command and the second read command is an SREAD command.

10. The apparatus of claim 8, wherein the second read command includes an address with an offset for the portion of the data in the second memory device.

11. The apparatus of claim 8, wherein the controller is configured to write a modified portion of data to the second memory device and wherein the modified portion of data was modified by a host.

12. The apparatus of claim 8, wherein the controller is configured to transfer the modified portion of data from the second memory device to the first memory device.

13. A method, comprising:
receiving a read command requesting data from a first memory device wherein the read command includes a read identification (RID) number having a first portion that identifies a location of the data in the first memory device and a second portion having a unique identifier to identify the read command from other commands; and
transferring the data from the location in the first memory device to a second memory device in response receiving the read command, wherein the second portion of the RID number including the unique identifier is transferred along with the data and wherein the first memory device and the second memory device are located on a dual in-line memory module (DIMM) coupled to a controller.

14. The method of claim 13, furthering including sending a signal to a host indicating the data has been transferred from the location in the first memory device to the second memory device.

15. The method of claim 13, further including receiving another read command requesting the data from the second memory device and transferring the data in response to the other read command.

16. The method of claim 13, wherein the RID number having a first portion that uniquely identifies the command and a second portion that identifies the location of the data in the first memory device.

17. The method of claim 13, wherein transferring the data from the location in the first memory device to the second memory device includes transferring data via a buffer in a controller.

18. The method of claim 13, further including receiving a write command for data modified by the host.

19. The method of claim 18, further including writing the modified data to the second memory device based at least in part on receiving the write command.

20. The method of claim 19, further including transferring the modified data from the second memory device to the first memory device based at least in part on receiving the write command.

* * * * *